United States Patent
Yamaharu

[11] Patent Number: 5,533,922
[45] Date of Patent: Jul. 9, 1996

[54] METHOD AND APPARATUS FOR PRETREATING ELECTRONIC COMPONENT MANUFACTURING FRAME

[76] Inventor: Eikichi Yamaharu, 15-10, Kourigaoka 8-chome, Hirakata-shi, Osaka, Japan

[21] Appl. No.: 214,698

[22] Filed: Mar. 18, 1994

[30] Foreign Application Priority Data

Mar. 22, 1993 [JP] Japan ................... 5-062227

[51] Int. Cl.⁶ ............... B24C 1/00; B24C 3/08
[52] U.S. Cl. ............. 451/38; 451/78; 451/81
[58] Field of Search ............. 451/38, 39, 40, 451/78, 81

[56] References Cited

U.S. PATENT DOCUMENTS 4,555,876  12/1985  Ohtake .
4,561,219  12/1985  Harada et al. ............. 451/81
4,674,238   6/1987  Suzuki et al. .

FOREIGN PATENT DOCUMENTS 0441300  8/1991  European Pat. Off. .
2148820  6/1990  Japan .
5220755  8/1993  Japan .
5212730  8/1993  Japan .

Primary Examiner—Maurina T. Rachuba
Attorney, Agent, or Firm—Michael D. Bednarek; Marks & Murase

[57] ABSTRACT

A method is provided for pretreating an electronic component manufacturing frame which is prepared by punching. The method comprises blasting abrasive particles entrained in a high speed air stream toward the frame, wherein the abrasive particles has an average diameter of no more than 200 micrometers, preferably no more than 100 micrometer, particularly no more than 50 micrometers. The abrasive particles may be advantageously made of glass.

12 Claims, 17 Drawing Sheets

METHOD AND APPARATUS FOR PRETREATING ELECTRONIC COMPONENT MANUFACTURING FRAME

BACKGROUND OF THE INVENTION

1. Field of the Invention

This invention relates to a method and apparatus for pretreating an electronic component manufacturing frame such as a leadframe. More particularly, the present invention relates to a method and apparatus for peening surfaces of a leadframe before using it for manufacturing electronic components.

2. Description of the Prior Art

As is well known, electronic components or semiconductor devices such as ICs or LSIs are typically made by using a specially designed manufacturing frame called "leadframe". Due to a recent tendency of highly integrating electronic components, the leadframe is also made to have a highly sophisticated pattern.

FIGS. 15 through 18 show an example of highly sophisticated leadframe. Specifically, the leadframe generally represented by reference sign F includes a plurality of chip bonding islands (d) (only one shown) each surrounded by a rectangularly arranged group of dam bars (a). Each of the islands (d) is connected to the leadframe via support bars (h).

The leadframe F further includes a group of outer leads (b) extending outwardly from each dam bar (a), and a group of inner leads (c) extending inwardly from the dam bar toward a corresponding island (d). Initially, the group of inner leads (c) have wire bonding ends connected to each other by a tie bar (e), as shown in FIG. 16.

The leadframe F may have a small thickness of 0.2 mm for example. Further, due to the high degree of integration, the outer leads (b) in each group may be densely arranged at a small pitch of 0.5 mm for example. Obviously, the pitch between the inner leads (c) in the same group is substantially equal to that between the outer leads (b) but reduces progressively toward the chip bonding island (d) (see FIGS. 15, 16 and 18).

In manufacture of electronic components, a semiconductor chip (not shown) is first bonded to each chip bonding island (d) of the leadframe F. Then, an electrically insulating adhesive tape (f) is applied to the inner leads (c) near each tie bar (e), and the tie bar (e) is cut off the inner leads (c) (see FIG. 18). Then, the chip is electrically connected to the inner leads (c) via metal wires (not shown). Then, a resin package is formed for a portion of the leadframe F (including the unillustrated chip) surround by each rectangularly group of dam bars (a), and portions of the dam bars (a) between the respective outer leads (b) are removed for making the respective outer leads (b) (and the inner leads as well) electrically independent from each other. Finally, the outer leads (b) and the support bars (h) are cut off the leadframe F, and the outer leads (b) are suitably bent.

The leadframe F may be prepared by etching a thin metal sheet for example. However, the etching method has been found very time-taking and costly.

Alternatively, the leadframe F may be prepared by punching a thin metal sheet. However, the punched leadframe has been found to be disadvantageous in the following respects.

First, the punched leadframe F is made to have localized internal stresses which result from the punching operation. Such stresses cause the leadframe F to have a tendency of warping, thereby failing to provide a high degree of flatness as required for providing a good product quality.

Secondly, the localized internal stresses of the leadframe also cause the inner leads (c) to deform at the time of severing from the tie bars (e). Obviously, such a deformation of the inner leads (c) results in improper wire bonding or shorting contact between the inner leads (c), consequently reducing the production yield of the electronic components (namely, reducing the production cost). While it is possible to restrain the deformation of the inner leads (c) by the electrically insulating resin tape (f) (FIG. 16) to a certain extent, the tape will not remove the deforming tendency of the inner leads (c). The use itself of the tape (f) causes a production cost increase.

In the third place, the punching operation will inevitably results in formation of burrs (g) (see FIG. 17) at the various edges of the leadframe F (including the edges of the respective leads). Obviously, due to the presence of the burrs, the resin package (not shown) subsequently formed will have a tendency of allowing moisture entry at the burrs, thereby causing a quality deterioration (e.g. a circuit fault). Further, the presence of the burrs (g) (FIG. 17) hinders a solder plating operation which is required for improve electrical connection between the respective leads (b, c) and their associated elements.

SUMMARY OF THE INVENTION

It is, therefore, an object of the present invention to solve at least a part of the various problems caused by localized internal stresses which remain in an electronic component manufacturing frame after punching.

According to one aspect of the present invention, there is provided a method for pretreating an electronic component manufacturing frame which is prepared by punching, the method comprising blasting abrasive particles entrained in a high speed air stream toward the frame, the abrasive particles having an average diameter of no more than 200 micrometers.

Preferably, the abrasive particles may have an average diameter of no more than 100 micrometers, particularly no more than 50 micrometer. Further, the abrasive particles may advantageously comprise spherical glass particles.

As previously described in connection with the prior art, the punched frame has localized internal stresses which would subsequently cause deformation of the frame. The high speed blasting of the abrasive particles, which is relatively small in size, is considered effective for dispersing the internal stresses over the entire area of the frame and for providing a peening effect to harden the surfaces of the frame as required for preventing or reducing the liberation of the internal stresses. Further, the high speed blasting of the glass particles also provides a cleaning effect for removing the burrs of the frame which inevitably results from the punching operation.

According to another aspect of the present invention, there is provided an apparatus for pretreating an electronic component manufacturing frame which is prepared by punching, the apparatus comprising a blasting chamber, a transfer assembly for transferring the frame in the blasting chamber, and at least one blasting nozzle arranged in the blasting chamber for blasting abrasive particles entrained in a high speed air stream toward the frame, wherein the abrasive particles has an average diameter of no more than 200 micrometers.

Preferably, a low pressure blower such as a Root's blower may be made to supply air to the blasting nozzle at a low guage pressure of 0.3–0.6 atm for discharging the air stream at a high speed of no less than 100 m/s. Due to the use of such a blower, the blasting nozzle may be made to have a discharge opening whose area is rendered relatively large for pretreating the frame uniformly over the entire surfaces thereof.

According to a preferred embodiment of the present invention, there are provided at least two blasting nozzles for blasting the abrasive particles toward two opposite surfaces of the frame. In this case, one of the blasting nozzles is effective not only for pretreating the frame but also removing burrs of the frame while cleaning it.

Other objects, features and advantages of the present invention will be fully understood from the following detailed description given with reference to the accompanying drawings.

DETAILED DESCRIPTION OF THE PREFERRED EMBODIMENT

Referring to FIGS. 1 through 14 of the accompanying drawings, there is illustrated a surface pretreating apparatus 1 for electronic component manufacturing frames according to an embodiment of the present invention. The surface pretreating apparatus 1 utilizes an abrasive blasting apparatus. Each of the frames may be a leadframe having such a configuration as shown in FIGS. 15 through 18 for example.

Figure 1:
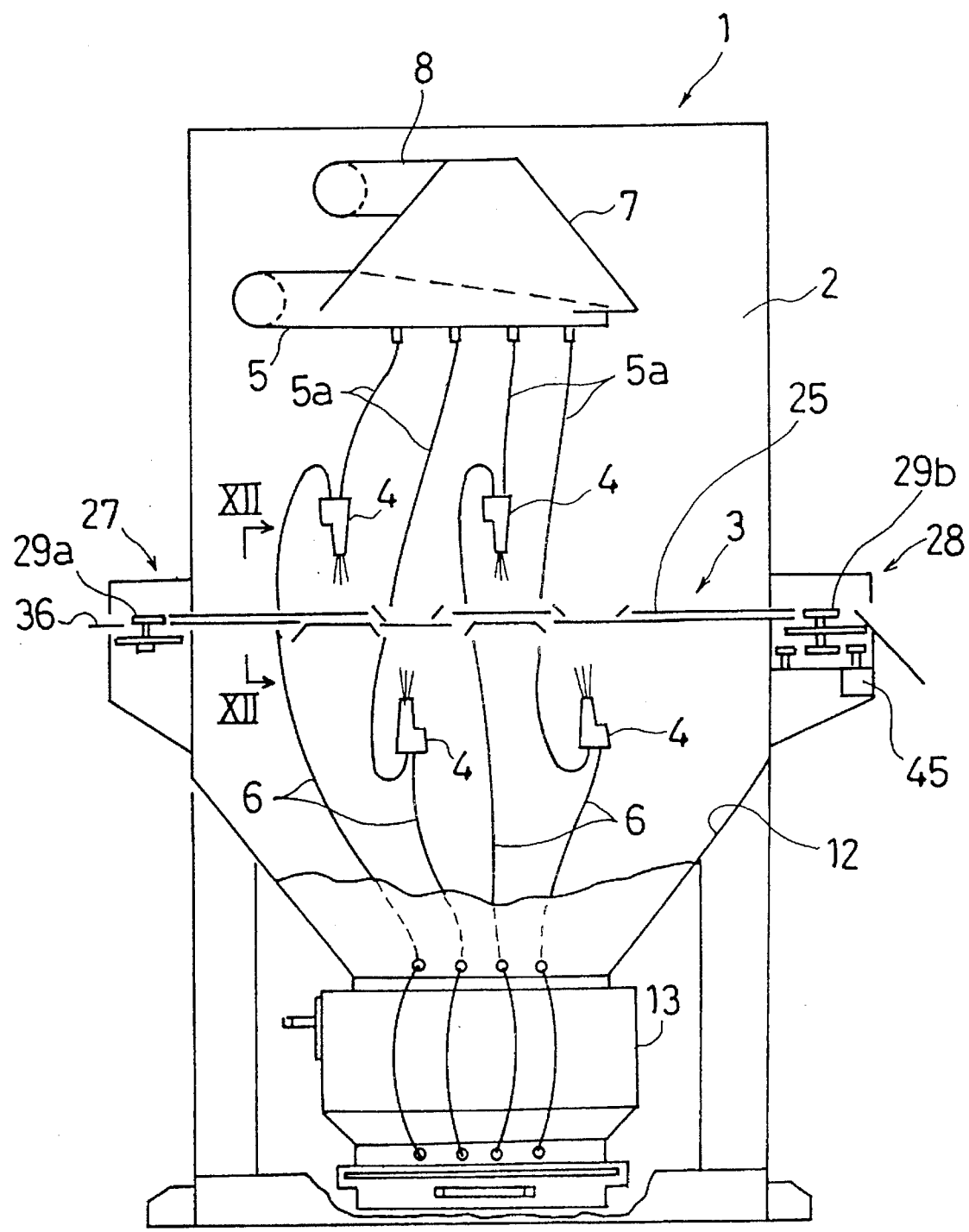
FIG. 1 is a schematic front view showing an overall arrangement of a pretreating apparatus according to a preferred embodiment of the present invention.
Figure 2:
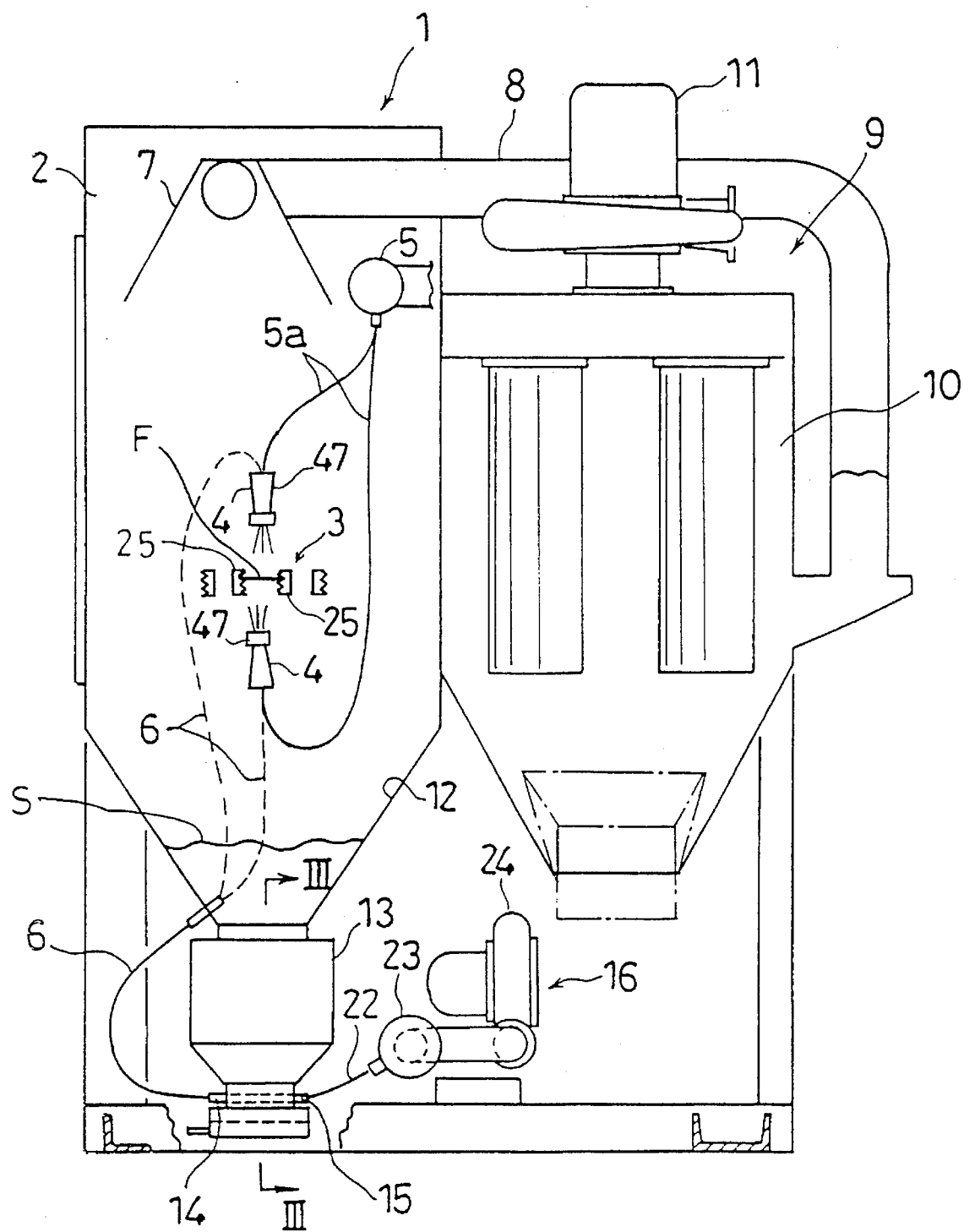
FIG. 2 is a schematic side view showing the same pretreating apparatus.

As shown in FIGS. 1 and 2, the surface pretreating apparatus 1 comprises a blasting chamber 2 flanked by an entry container 27 and an exit container 28. These containers are held in communication with the blasting chamber 2. A transfer assembly 3 extends substantially horizontally through the blasting chamber 2 between the entry and exit containers 27, 28 for successively transferring a plurality of leadframes F (see FIG. 2), as described more in detail hereinafter.

A plurality of blasting nozzles 4 are arranged above and below the leadframe F transferred by the transfer assembly 3 with their respective nozzle openings directed toward the leadframe F. The blasting nozzles 4 are connected to an air distributing pipe 5 through respective air supply hoses 5a. The air distributing pipe 5 is arranged in the blasting chamber 2 at an upper portion thereof and connected to a low pressure air generating source (not shown) such as a Root's blower. Alternatively, the air distributing pipe 5 may be connected to a high pressure air generating source (not shown) such as a compressor.

As shown in FIG. 2, an umbrella-like dust collecting hood 7 is also disposed at an upper portion of the blasting chamber 2 slightly behind the air distributing pipe 5. The hood 7 has a top portion connected through a dust pipe 8 to a dust catcher 9 arranged outside and behind the blasting chamber 2. The dust catcher 9, which may be a conventional one, comprises a dust collecting chamber 10, and a suction blower 11 arranged above the chamber 10 for sucking dust-laden air through the dust pipe 8 into the dust collecting chamber 10. The dust is removed within the dust collecting chamber 10 by filtration.

The blasting chamber 2 has a bottom hopper portion 12 which diametrically reduces downward. The hopper portion 12 is connected to an abrasive recovery container 13 arranged under the hopper portion 12.

Figure 3:
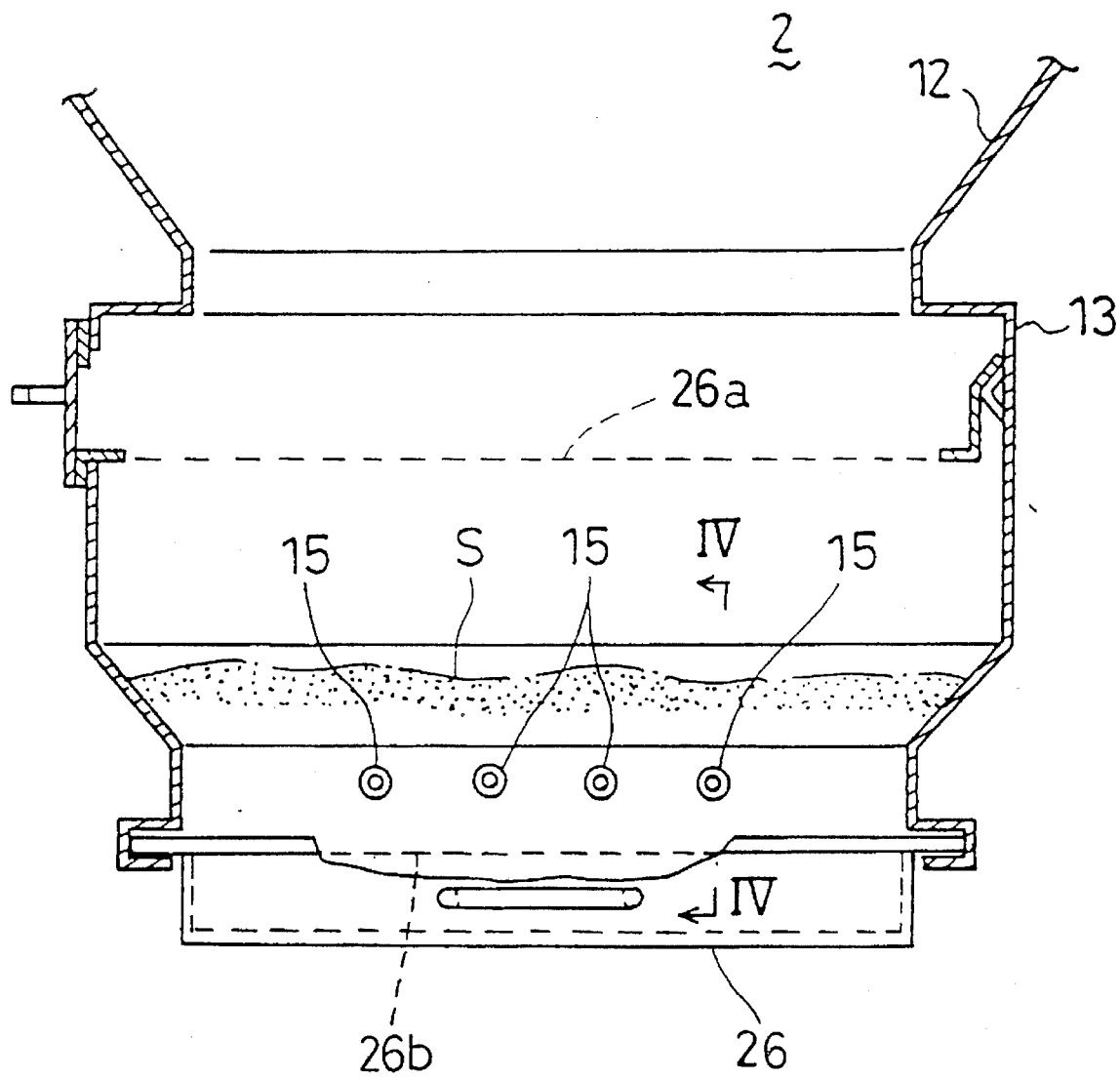
FIG. 3 is a sectional view taken along lines III—III in FIG. 2.
Figure 4:
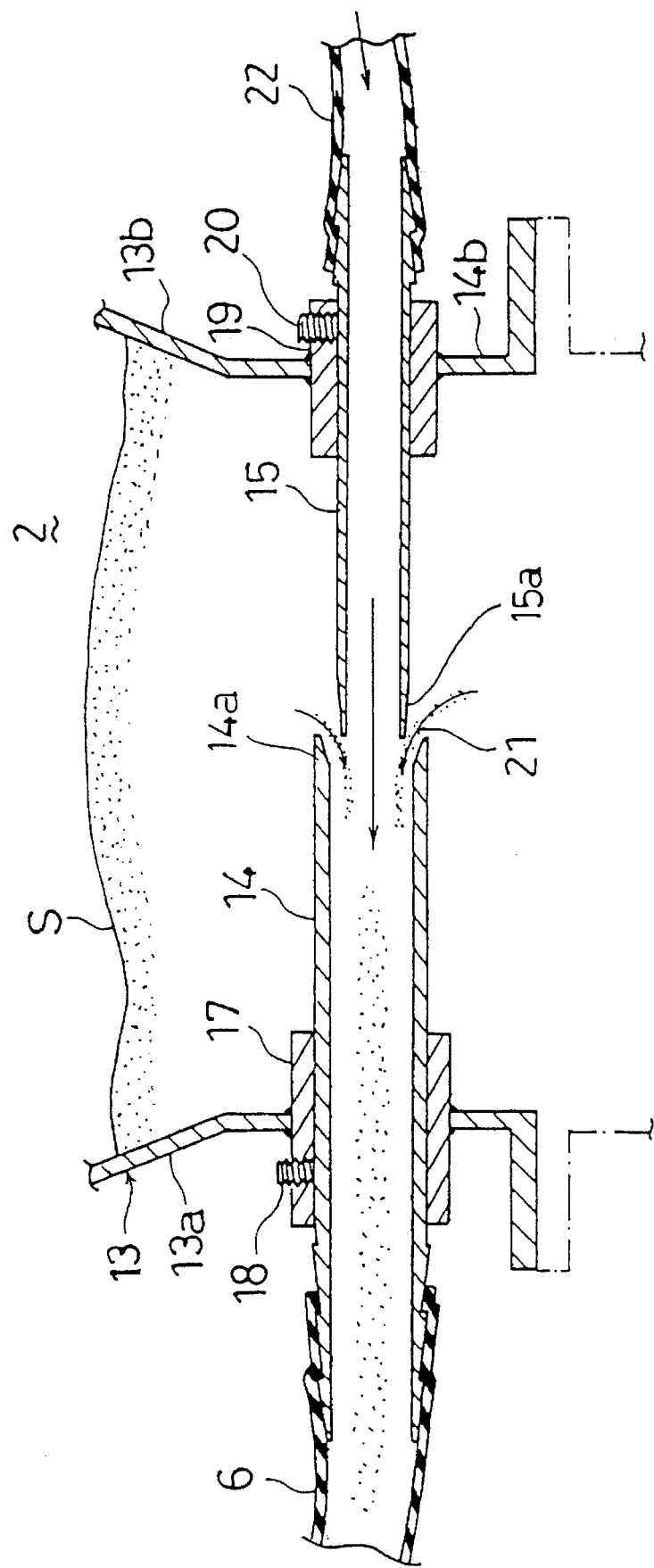
FIG. 4 is a sectional view taken along lines IV—IV in FIG. 3.

As more specifically illustrated in FIGS. 3 and 4, the abrasive recovery container 13 is in the form of a collector container connected to the lower end of the hopper portion 12 for receiving the abrasive material S falling from the hopper portion 12. The recovery container 13 is provided, at an upper portion thereof, with an upper screen 26a for removing coarser dust while allowing passage of finer dust and the abrasive material S. The recovery container 13 is also provided, at a lower portion thereof, with a drawer 26 which includes a lower screen 26b having a mesh size smaller than the particle size of the abrasive material S. Thus, the lower screen 26b prevents passage of the abrasive material S while admitting finer dust into the drawer 26 for removal.

The abrasive recovery container 13 further includes a plurality of abrasive suction pipes 14 each having a suction inlet 14a, and a corresponding number of air discharge pipes 15 (see FIGS. 3 and 4) each having a discharge end 15a in axial alignment with the suction inlet 14a of a corresponding abrasive suction pipe 14 with an annular clearance 21 (see FIG. 4) formed therebetween. When air is discharged from the discharge pipes 15 respectively into the abrasive suction pipes 14, the abrasive material S is drawn into the suction pipes 14 and carried by the air.

The abrasive suction pipes 14 are connected to the respective blasting nozzles 4 through respective abrasive supply hoses 6, as shown in FIGS. 1, 2 and 4. Similarly, the air discharge pipes 15 are connected through respective air supply hoses 22 to a common surge tank 23 which is in turn connected to a blower 24, as shown in FIG. 2.

As shown in FIG. 4, each of the abrasive suction pipes 14 is mounted substantially horizontally to a wall portion 13a of the recovery container 13 by means of a first sleeve 17 penetrating through and fixed to the wall portion 13a for slidably receiving the suction pipe 14. A first set screw 18 radially extends through the sleeve 17 into engagement with the suction pipe 14. Thus, the suction pipe 14 is horizontally (axially) adjustable in position by loosening and tightening the set screw 18.

Similarly, each of the air discharge pipes 15 is mounted substantially horizontally to another wall portion 13b of the recovery container 13 by means of a second sleeve 19 penetrating through and fixed to the wall portion 13b for slidably receiving the discharge pipe 15, and a second set screw 20 radially extending through the sleeve 19 into engagement with the discharge pipe 15. Thus, the discharge pipe 15 is horizontally (axially) adjustable in position by loosening and tightening the set screw 20.

As clearly appreciated from FIG. 4, the outer diameter of each air discharge pipe 15 is rendered smaller than the inner diameter of each abrasive suction pipe 14. Further, the suction inlet 14a of the suction pipe 14 internally flares toward the discharge pipe 15, whereas the discharge end 15a of the discharge pipe 15 externally tapers toward the suction inlet pipe 14. The annular clearance 21 between the suction inlet 14a and the discharge end 15a is adjustable in size (including both radial and axial dimensions) by positionally adjusting one or both of the suction and discharge pipes 14, 15.

In operation, a suction force is applied to the dust collecting hood 7 under the action of the dust catcher 9 (namely, the suction blower 11 shown in FIG. 2). Further, the unillustrated air generating source is actuated to supply air to the respective blasting nozzles 4 through the air distributing pipe 5 and the air supply hoses 5a, whereas the other blower 24 (FIG. 2) is actuated to supply air to the respective air discharge pipes 15 through the surge tank 23 and the air supply hoses 22. During the blasting operation, the abrasive material S in a given amount is circulated for repeated blasting operation.

The abrasive is blasted by high speed air from the respective blasting nozzles 4 for pretreating the surfaces of the leadframe F. The abrasive thus blasted in the blasting chamber 2 fall gravitationally into the recovery container 13 (FIGS. 3 and 4). Upon entry into the recovery container 13, coarser dust contained in the abrasive is separated by the upper screen 26a for removal.

A portion of finer dust, which is relatively small in specific weight, is fluidized by the air within the blasting chamber and carried to the dust collecting hood 7 for removal by the dust catcher 9 (FIG. 2). On the other hand, a portion of finer dust, which is relatively large in specific weight, moves downward with the blasted abrasive in the abrasive recovery container 13 but is separated therefrom by selectively passing through the lower screen 26b, as previously described.

In the abrasive recovery container 13, air flowing at high speed through each air discharge pipe 15 is supplied into the corresponding abrasive suction pipe 14 to pump the abrasive material S into the suction pipe 14 through the annular clearance 21. Further, a negative pressure is generated at each blasting nozzle 4 (FIG. 1) by the high speed air flow supplied through the corresponding air supply hose 5a, thereby blasting the abrasive toward the leadframe F. In this way, the pumping force (or dynamic pressure) generated at the suction pipe 14 is combined with the negative pressure generated at the blasting nozzle 4 for effectively transferring the abrasive up to a relatively high level where the blasting nozzle 4 is located.

In addition, the size of the annular clearance 21 is adjustable by horizontally (namely, axially) displacing one or both of the abrasive suction pipe 14 and the air discharge pipe 15. Thus, it is possible to adjust the amount of the abrasive blasted from each blast nozzle 4 per unit time depending on the kind, particle size, and etc. of the abrasive.

FIGS. 5 through 12 show a preferred example of the transfer assembly 3. However, the transfer assembly 3 may be otherwise designed.

The illustrated transfer assembly 3 includes a parallel pair of endless transfer belts 25 spaced slightly from each other and each having a transfer path portion 25a. The endless transfer belts 25 are held in frictional engagement with respective entry side pulleys 29a in the entry container 27 (FIGS. 5–7), and with respective exit side pulleys 29b in the exit container 28 (FIGS. 8–11).

Figure 7:
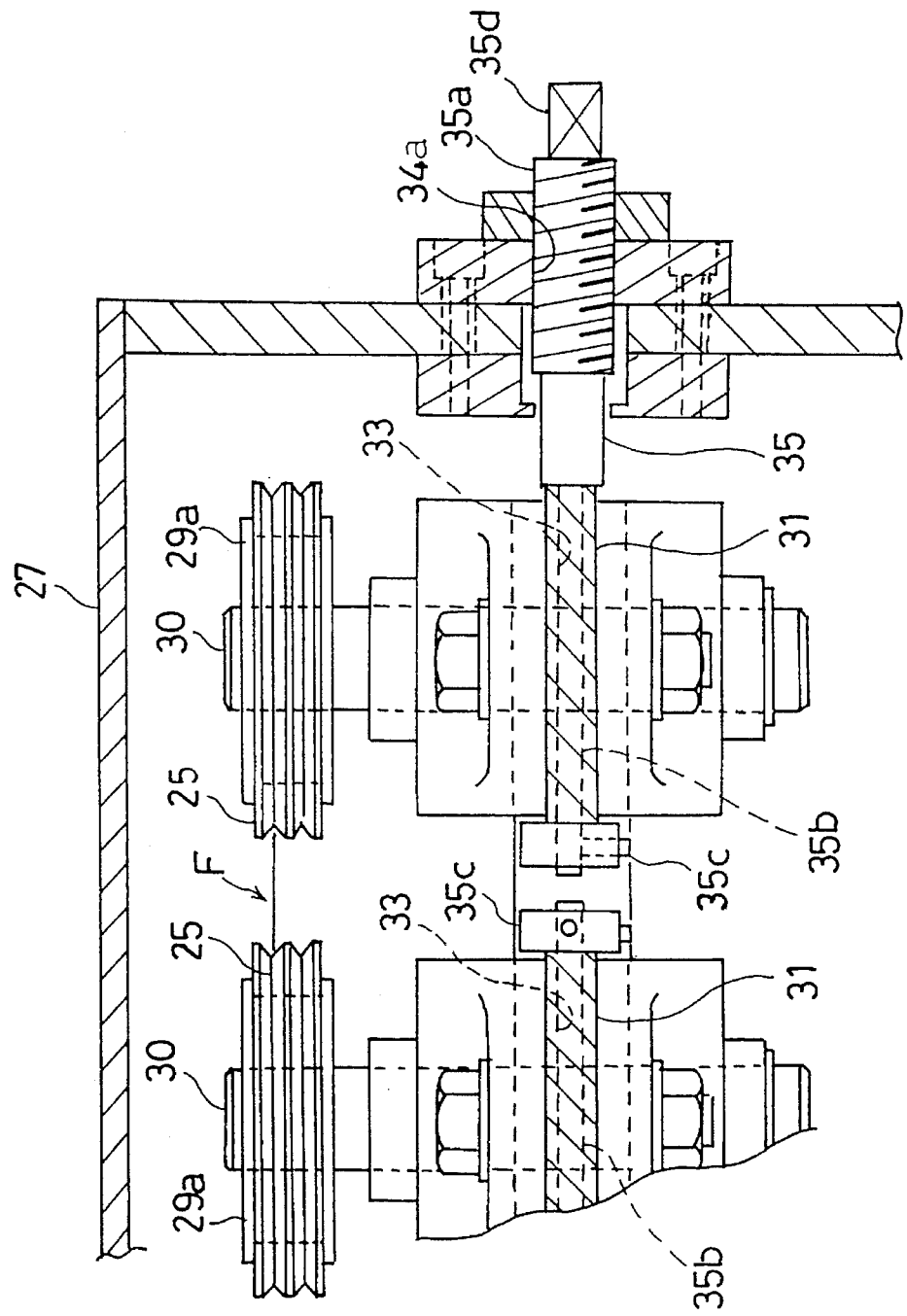
FIG. 7 is a sectional view taken along lines VII—VII in FIG. 6.
Figure 12:
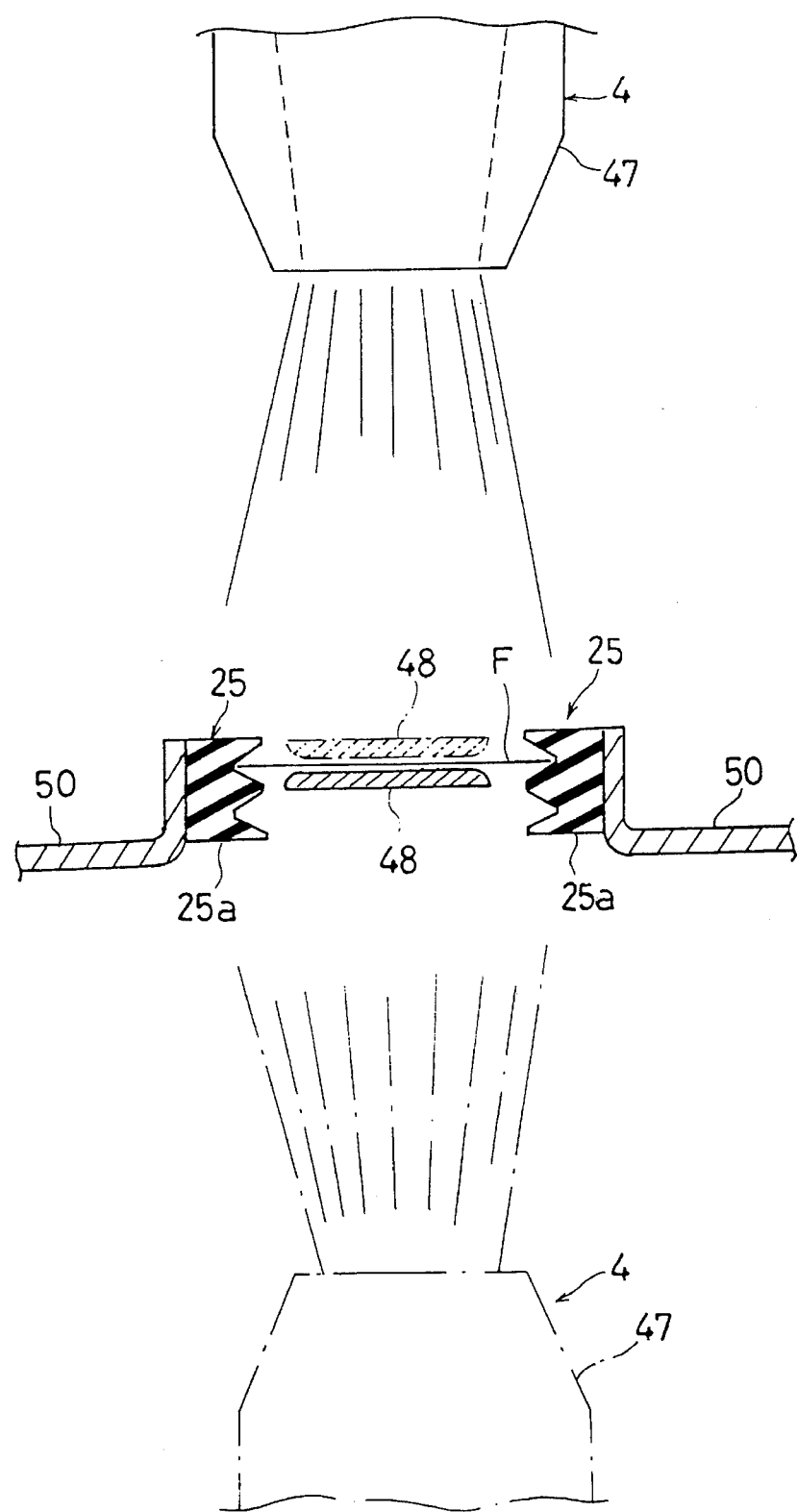
FIG. 12 is a sectional view taken along lines XII—XII in FIG. 1.

According to the illustrated embodiment, each of the transfer belts 25 is a known V-belt with its grooved side facing the grooved side of the other transfer V-belt for conveniently retaining the leadframe F at a V-groove, as shown in FIG. 7 (see FIG. 12 as well). The V-belt 25 may be preferably made of a reinforced rubber to minimize abrasion by the abrasive blasting (as required for prolonging the life of the transfer assembly 3) while also reducing unexpected damages to the leadframe F.

According to the illustrated embodiment, the exit side pulleys 29b are rotationally driven for moving the transfer belts 25. Further, the spacing between the entry side pulleys 29a is rendered adjustable, as also is the spacing between the exit side pulleys 29b.

Figure 5:
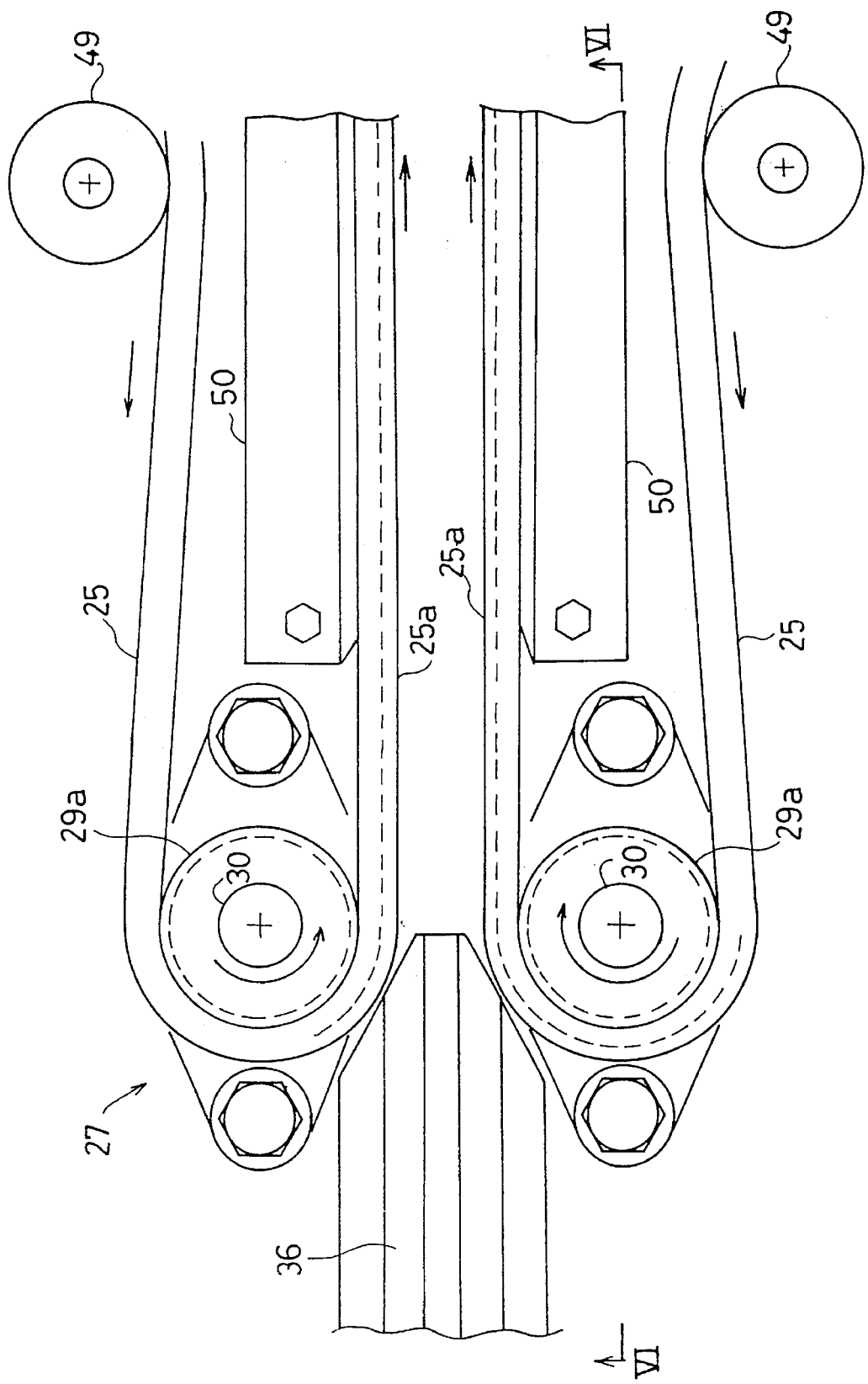
FIG. 5 is a plan view showing an entry portion of a transfer assembly incorporated in the pretreating apparatus.
Figure 6:
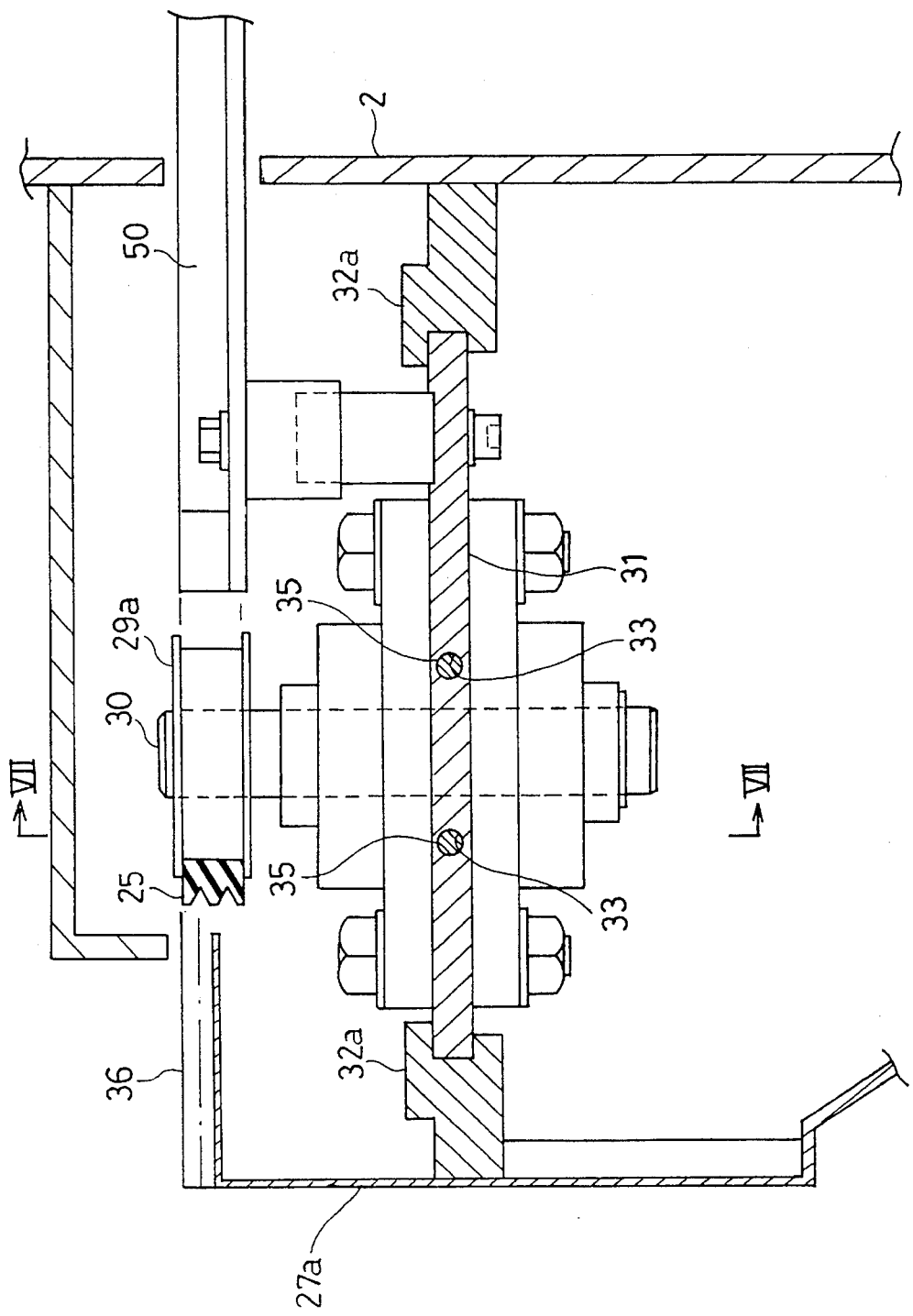
FIG. 6 is a sectional view taken along lines VI—VI in FIG. 5.

As shown in FIGS. 5 through 7, each of the entry side pulleys 29a is mounted at the upper end of a vertical support shaft 30 which is in turn mounted on a movable member 31. The movable member 31 is slidably supported between a pair of guide members 32a fixed in the entry container 27, so that the movable member 31 is slidable transversely of the leadframe transfer path. The movable member 31 has a pair of guide bores 33 for receiving a corresponding pair of adjusting rods 35 which extend transversely of the leadframe transfer path.

As shown in FIG. 7, each of the adjusting rods 35 has an externally threaded portion 35a for screwing into an internally threaded member 34a which is fixed to a wall of the entry container 27. The adjusting rod 35 further has a diametrically smaller fitting portion 35b received in the corresponding guide bore 33 of the movable member 31, an enlarged head 35c at an inner end of the rod 35 for engagement with the movable member 31, and an outer engaging end 35d for engagement with a suitable turning tool (not shown). Thus, by turning the adjusting rod 35, the movable member 31 may be made to displace transversely of the transfer path toward and away from the other movable member, thereby adjusting the spacing between the respective entry side pulleys 29a (namely, the spacing between the transfer path portions 25a of the transfer belts 25).

Indicated by reference numeral 36 in FIGS. 1 and 5 is a guide for introducing the leadframe F to a position between the transfer belts 25.

As shown in FIGS. 8 through 11, the exit side pulleys 29b are supported substantially in the same manner as the entry side pulleys 29a. Specifically, each of the exit side pulleys 29b is mounted at the upper end of a vertical support shaft 37 which is in turn mounted on a movable member 38. The movable member 38 is slidably supported by a pair of guide members 32b fixed in the exit container 28, so that the movable member 38 is slidable transversely of the leadframe transfer path. The movable member has a pair of guide bores 39 for receiving a corresponding pair of adjusting rods 40.

Figure 10:
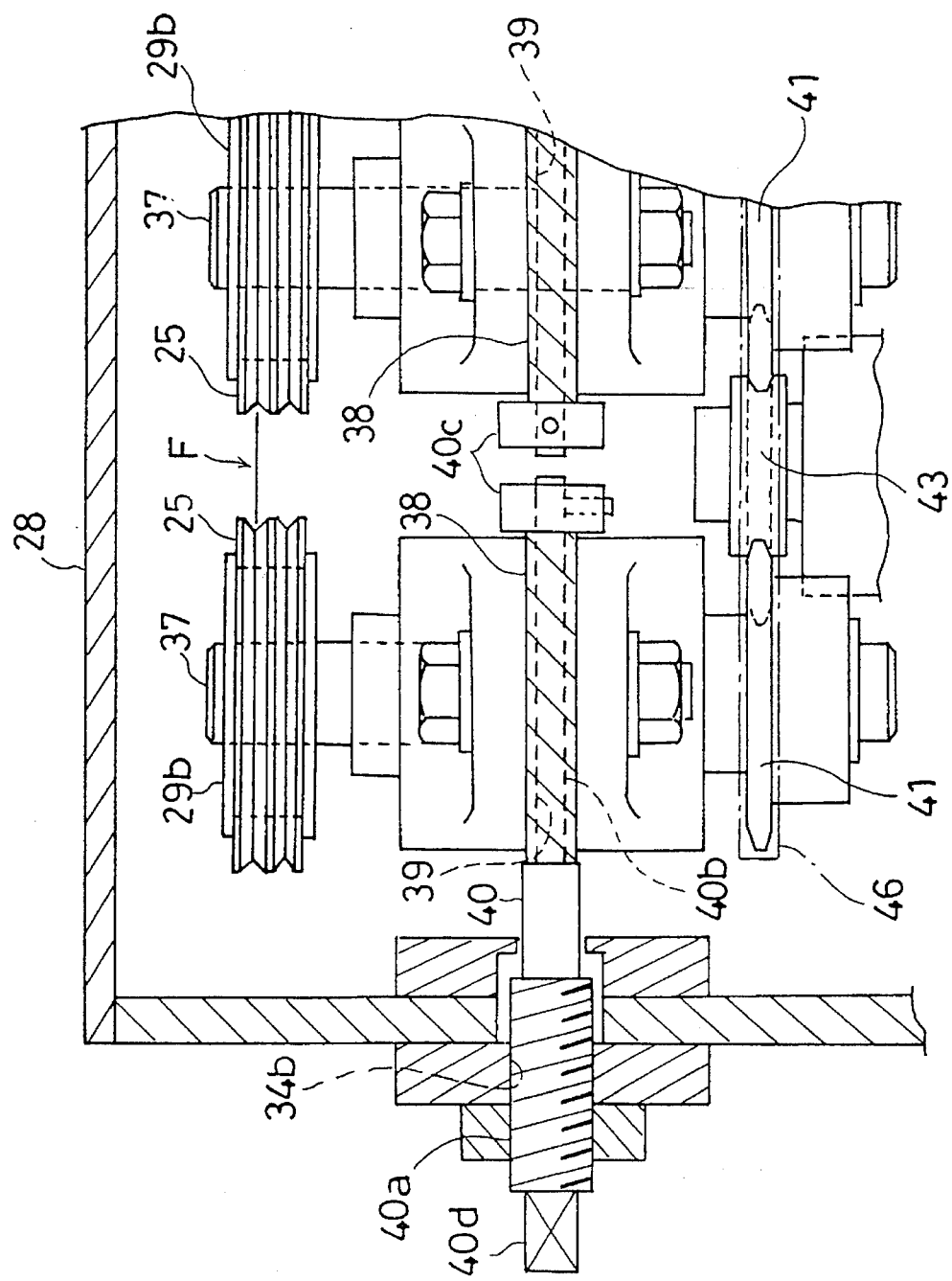
FIG. 10 is a sectional view taken along lines X—X in FIG. 9.

As shown in FIG. 10, each of the adjusting rods 40 has an externally threaded portion 40a for screwing into an internally threaded member 34b which is fixed to a wall of the exit container 28. The adjusting rod 40 further has a diametrically smaller fitting portion 40b received in the corresponding guide bore 39 of the movable member 38, an enlarged head 40c at an inner end of the rod 40 for engagement with the movable member 38, and an outer engaging end 40d for engagement with a suitable turning tool (not shown). Thus, by turning the adjusting rod 58, the movable member 38 may be made to displace transversely of the transfer path toward and away from the other movable member, thereby adjusting the spacing between the respective exit side pulleys 29b.

As shown in FIGS. 8 through 11, the respective support shafts 37 for the exit side pulleys 29b have their lower ends provided with driven sprockets 41 which are equal in diameter. An idle sprocket 43 is rotatably mounted on a stationary mount 42a (FIG. 9) within the exit container 28, whereas a drive sprocket 44 connected to a motor 45 (FIG. 9) is mounted on another stationary mount 42b. The respective sprockets 41, 43, 44 are all held at an equal height, as clearly appreciated in FIGS. 9 and 10.

Figure 8:
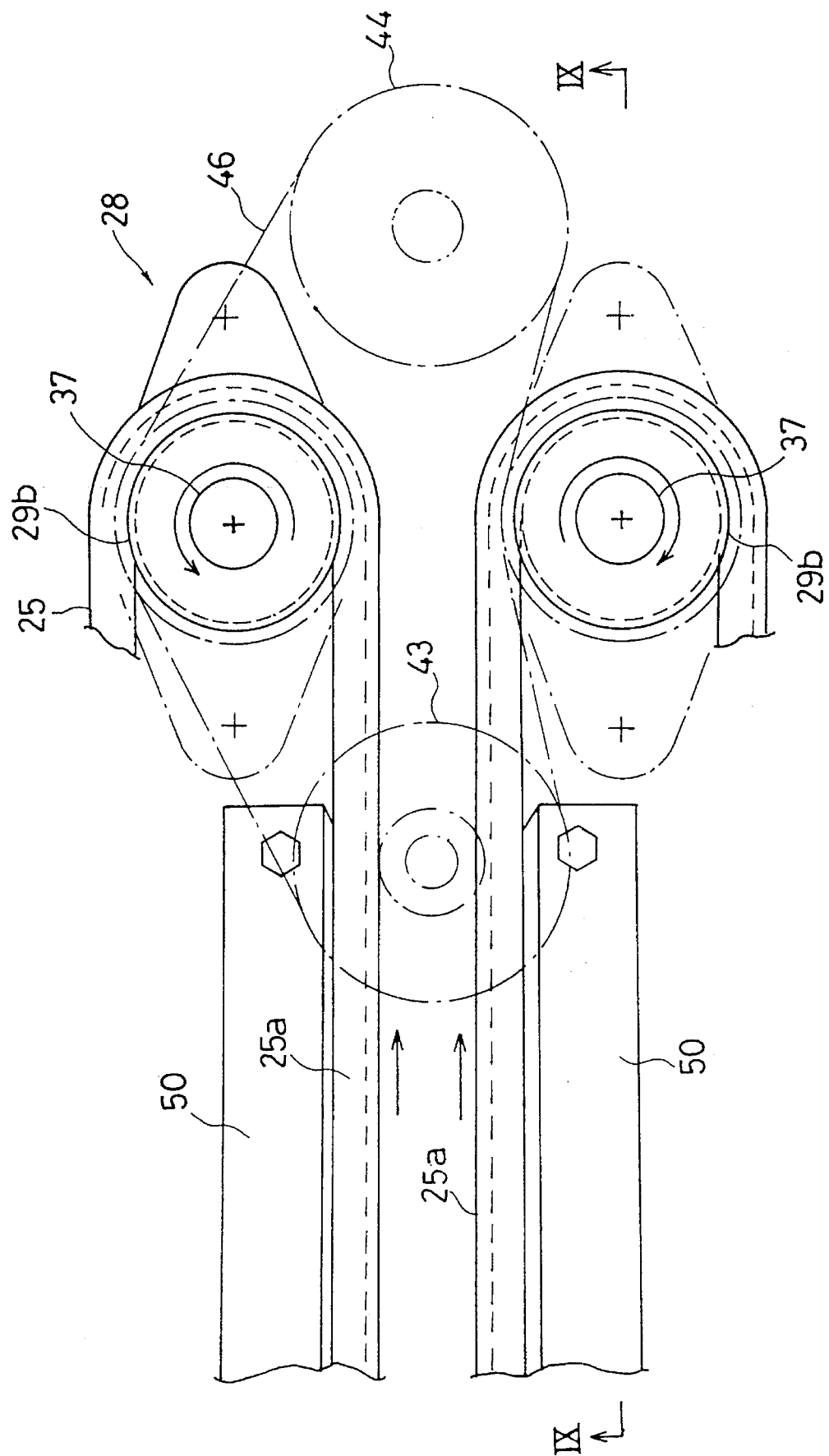
FIG. 8 is a plan view showing an exit portion of the transfer assembly.
Figure 9:
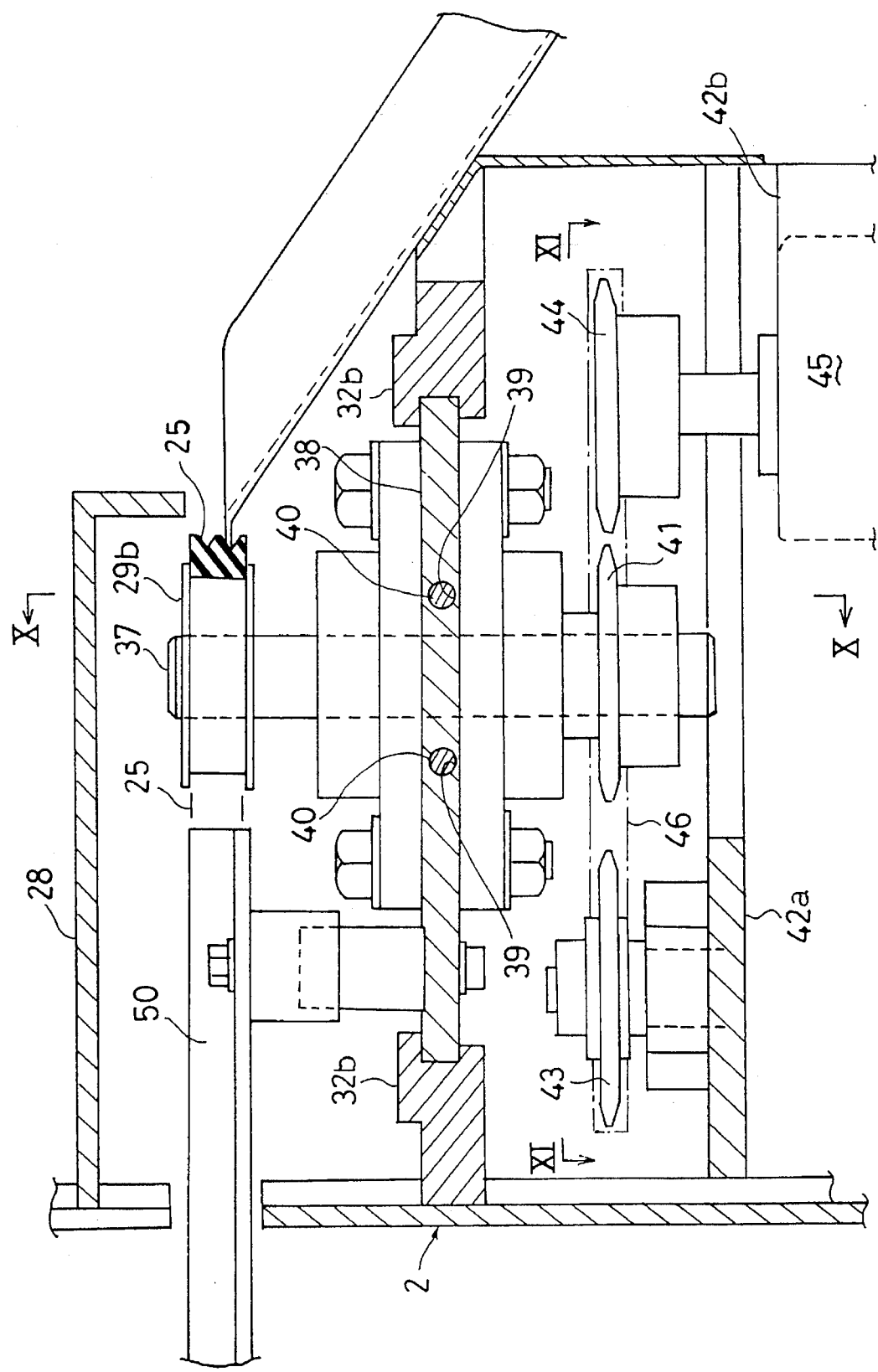
FIG. 9 is a sectional view taken along lines IX—IX in FIG. 8.
Figure 11:
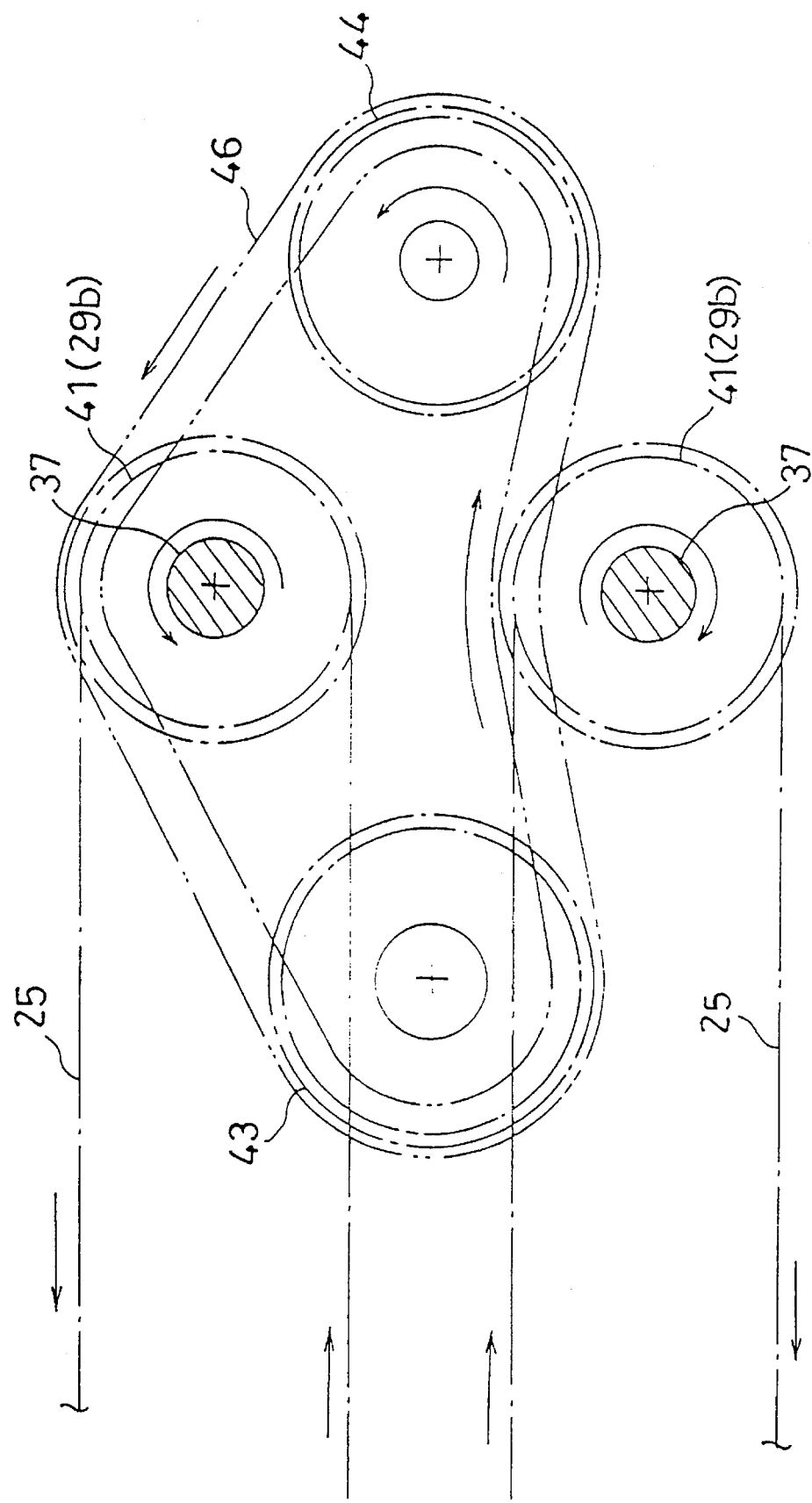
FIG. 11 is a sectional view taken along lines XI—XI in FIG. 9.

An endless drive chain 46 is guided by the respective sprockets 41, 43, 44 in engagement therewith. For causing the respective driven sprockets 41 to rotate in opposite directions, one of the driven sprockets 41 is made to internally contact the endless drive chain 46 while the other driven sprocket 41 is made to externally contact the same chain, as shown in FIGS. 8 and 11. As a result, it is possible to move the transfer path portions 25a of the respective transfer belts 25 synchronously at the same speed and in the same transfer direction (namely, from the entry container 27 to the exit container 28).

Further, when the exit side pulleys 29b are moved transversely of the leadframe transfer path for a spacing adjustment, the driven sprockets 41 are also moved corresponding. Thus, the endless drive chain 46 can be always held in non-loosening engagement with the sprockets 41, 43, 44 as long as the spacing adjustment is performed symmetrically with respect to both exit side pulleys 29b.

As shown in FIGS. 5, 6, 8 and 9, a parallel pair of belt guides 50 extend from the respective entry side movable members 31 to the respective exit side movable members 38. Each of the belt guides 50 slidably guides the transfer path portion 25a of the corresponding transfer belt 25 from behind (FIGS. 5 and 8) and carries a tension pulley 49 (FIG. 5) in rolling contact with the transfer belt 25 for maintaining the linearity of the transfer path portion 25a of the belt.

Further, as shown in FIG. 12, each of the belt guides 50 fixedly supports a plurality of backup members 48 alternately above and below a plane containing the leadframe F. More specifically, the backup members 48 are arranged in corresponding relation to the blasting nozzles 4 which are directed alternately upward and downward. Those of the backup members 48 corresponding to the upwardly directed nozzles 4 are arranged above the plane of the leadframe F, whereas the remaining backup members corresponding to the downwardly directly nozzles 4 are arranged below the plane of the leadframe F. As a result, the upper surface of the leadframe F is backed up when the lower surface of the leadframe F is pretreated by abrasive blasting, whereas the lower surface of the leadframe F is backed up when the upper surface of the leadframe F is pretreated.

Preferably, each of the backup members 48 is coated with an elastic material such as rubber. The elastic coating provides a cushioning function and therefore serves to prevent damage, due to abrasive impingement, to the backup member 48 itself and the leadframe F backed up thereby.

Figure 13:
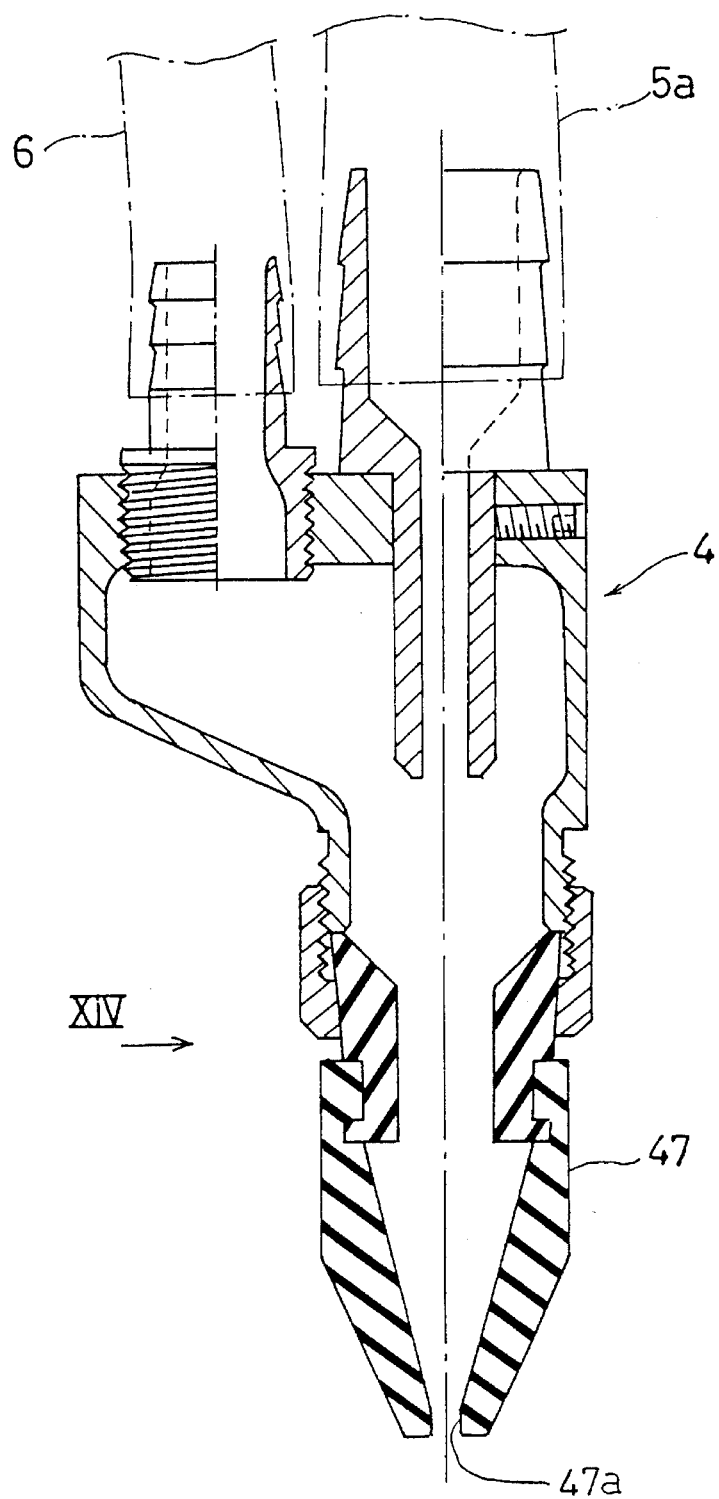
FIG. 13 is a vertical sectional view showing a blasting nozzle incorporated in the pretreating apparatus.
Figure 14:
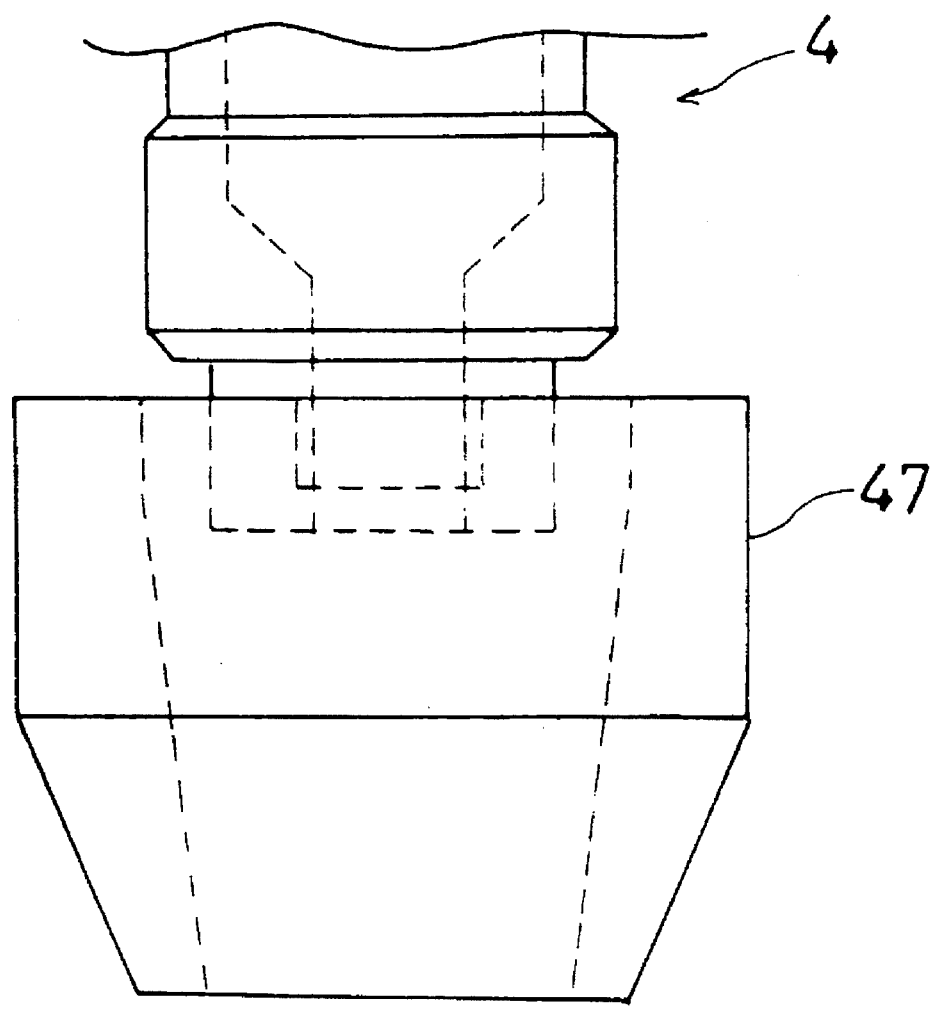
FIG. 14 is a view of the same blasting nozzle as seen in the direction of an arrow XIV in FIG. 13.

As shown in FIGS. 12 through 14, each of the blasting nozzles 4 has a nozzle piece 47 having an elongate discharge opening 47a whose longitudinal axis extends transversely to the leadframe transfer path (FIG. 12). The elongate discharge opening 47a is advantageous for uniformly pretreating the leadframe F over the entire width and length of the leadframe F. The nozzle piece 47 may be preferably made of an elastic material such as rubber to prevent or reduce abrasion by the abrasive material.

The abrasive material S may comprise spherical abrasive particles having an average diameter of no more than 200 micrometers, preferably no more than 100 micrometers (particularly 50 micrometers). Glass particles is preferred as the abrasive material S because the specific weight of glass is smaller than a metal and therefore suitable for pretreating, by abrasive blasting, the leadframe F which is very thin.

In general, glass particles has a specific weight lying in a range of 2–4, and a Vickers hardness lying in a range of 500–700 kg/mm$^2$. The average diameter of glass particles, which should preferably be as small as possible, may be determined depending on various parameters of the leadframe F such as the thickness of the leadframe, the degree of pattern sophistication of the leadframe. At present, glass particles of as small as about 30 micrometers in average diameter is readily available.

The following example illustrates the advantages obtainable by the surface pretreating operation according to the embodiment of the present invention.

EXAMPLE

Figure 15:
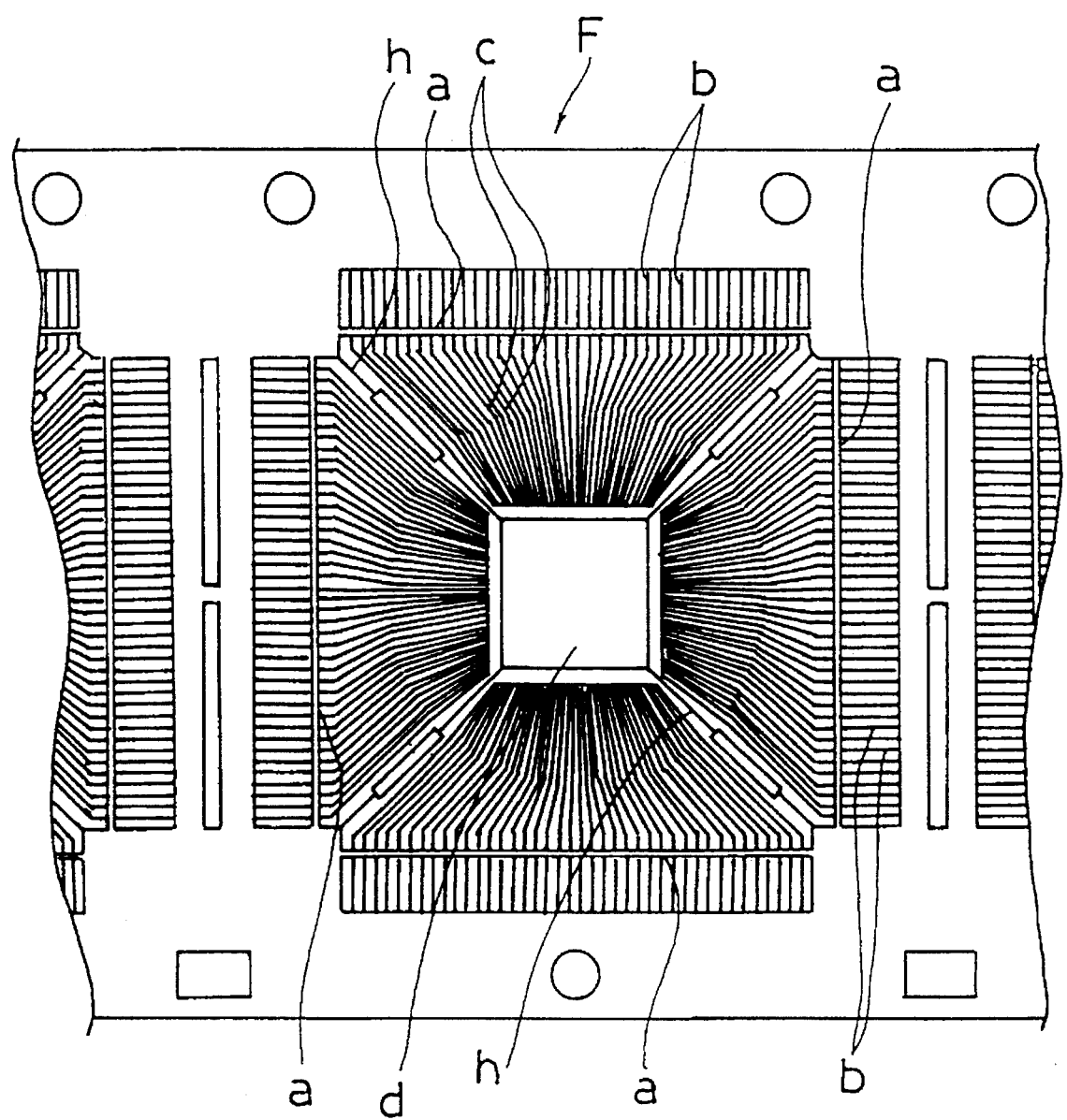
FIG. 15 is a plan view showing a leadframe as an example of an electronic manufacturing frame to which the present invention may be applied.
Figure 16:
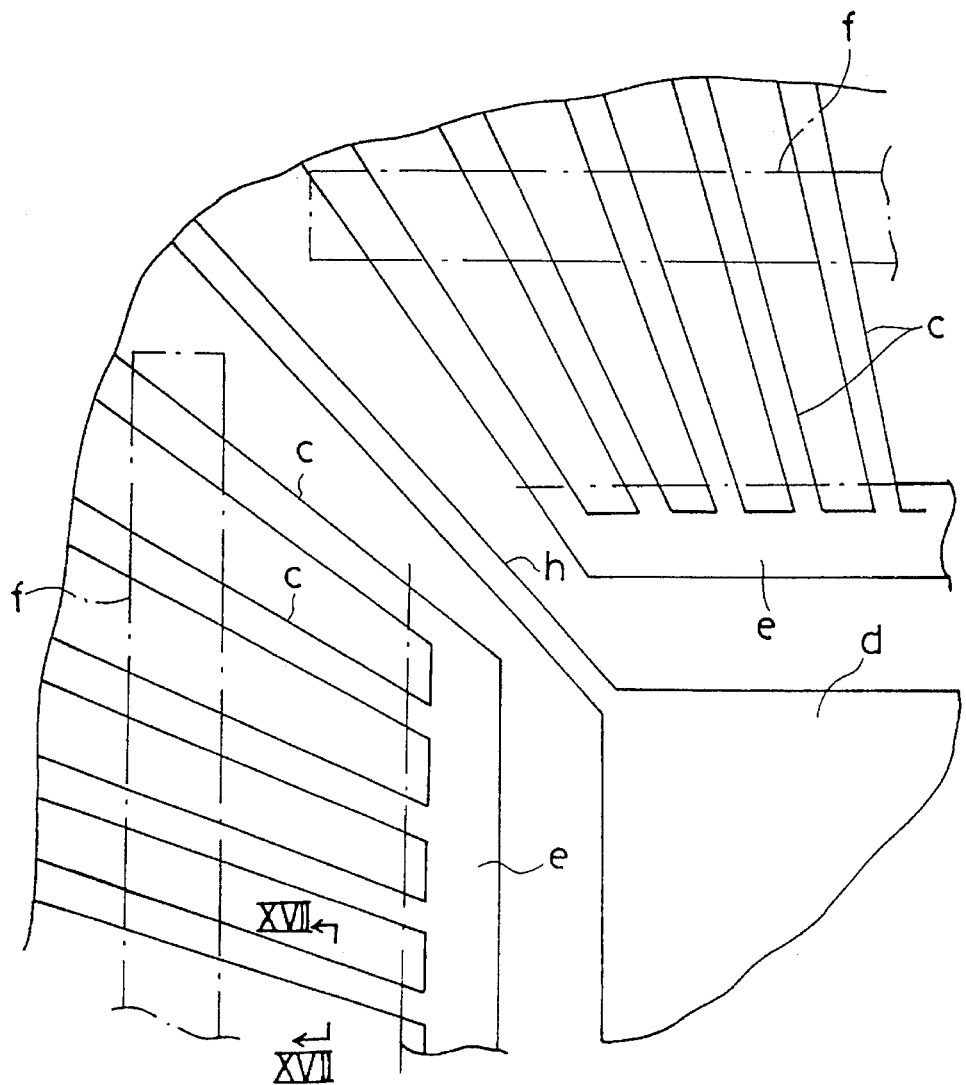
FIG. 16 is an enlarged fragmentary view showing a portion of the leadframe.
Figure 17:
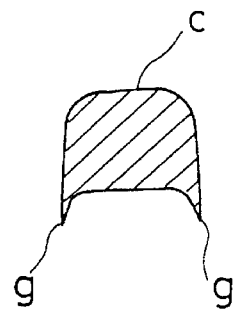
FIG. 17 is a sectional view taken along lines XVII—XVII in FIG. 16.
Figure 18:
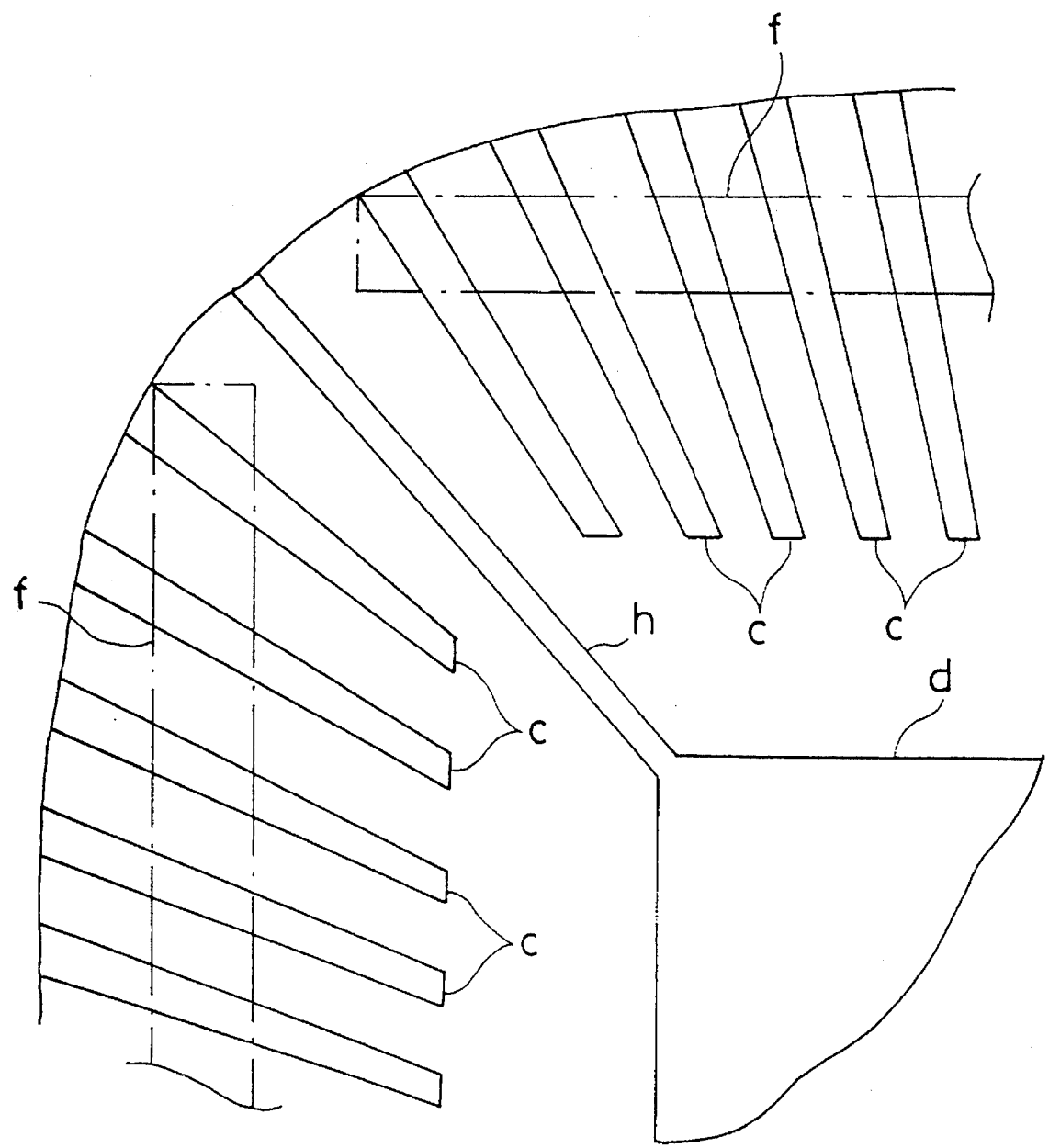
FIG. 18 is an enlarged fragmentary view similar to FIG. 16 but showing the same leadframe after cutting tie bars.

In the example, the leadframe F had a length of 164 mm, a width of 49 mm, and a thickness of 0.2 mm. As shown in FIGS. 15 and 16, the leadframe F had a sophisticated lead pattern which includes densely arranged outer leads (b), densely arranged inner leads (c), and etc., wherein the outer leads (b) were arranged at a minute pitch of 0.5 mm.

The discharge opening 47a of the nozzle piece 47 had a length of 30 mm and a width of 4 mm for blasting glass particles which has an average particle size of 38 micrometers (corresponding to 400-mesh).

In operation of the surface pretreating apparatus (blasting apparatus), high speed air was supplied to each of the blasting nozzles 4 through the corresponding air supply hoses 5a at a low guage pressure of 0.35 kg.f/cm$^2$ (corresponding to about 0.34 atm). The speed of blasting the glass particles together with air, which could be theoretically as high as 200 m/s, was at least 100 m/s (considering an energy loss at the time of entraining the glass particles). The leadframe F was made to pass the blasting nozzle 4 (each nozzle) longitudinally in 3 seconds, and the distance between the nozzle 4 and the leadframe transfer path was set at 200 mm. Each of the surfaces (upper and lower surfaces) of the leadframe F is pretreated once by blasting of the glass particles.

As a result of the pretreatment described above, the surfaces of the leadframe F were uniformly matte-finished or satin-finished. Further, the leadframe was rendered free from a tendency of warping which was experienced before the pretreatment. Further, the inner leads (c) (FIG. 16) were virtually free from deformation even after severing from the tie bars (e). Moreover, the burrs (g) (FIG. 17) of the leadframe F or leads were removed.

It was also experimentally confirmed that similar results can be also obtained when glass particles of 50 micrometers or 100 micrometers was used as the abrasive material though the effectiveness of the pretreatment is smaller than glass particles of 38 micrometers. It can be thus concluded that the effectiveness of the pretreatment increases progressively as the diameter of the glass particles reduces.

As previously described with reference to FIGS. 15–18, localized internal stresses are present in the leadframe F, and such stresses cause the leadframe to have a tendency of warping while also causing the inner leads (c) to deform at the time of severing from the tie bars (e). The high speed blasting of the glass particles, which is relatively small in size and specific weight, is considered effective for dispersing the internal stresses over the entire area of the leadframe F and for providing a peening effect to harden the surfaces of the leadframe F as required for preventing or reducing the liberation of the internal stresses. Further, the high speed blasting of the glass particles provides a cleaning effect for removing the burrs (g) of the leadframe F.

The preferred embodiment of the present invention is advantageous in the following points.

(1) Due to the elimination of the tendency of warping, the leadframe F can be made to have a high degree of flatness as required for providing a good product quality.

(2) Since the densely arranged inner leads (c) are prevented from deforming under the influences of the internal stresses even after separating the inner leads (c) from the tie bars (e), it is possible to avoid shorting or improper wire bonding, thereby increasing the production yield of the electronic components (namely, reducing the production cost).

(3) Due to the prevention of the deformation of the inner leads (c), it is unnecessary to fix the inner leads by an electrically insulating resin tape (f) (see FIG. 16) for example before separation from the tie bars (e), as opposed to the prior art.

(4) Due to the removal of the burrs (g) (see FIG. 17) of the leadframe F, it is possible to prevent moisture from entering into a subsequently molded resin package at the positions of the burrs, thereby eliminating or reducing a quality deterioration (e.g. a circuit fault) caused by moisture entry.

(5) Due to the removal of the burrs (g) (FIG. 17), it is possible to uniformly apply solder plating on the leads (b, c), thereby eliminating or reducing the disadvantages which might be caused by improper solder-plating.

(6) The blasting of the glass particles provides a matte or satin finish and a cleaning effect for facilitating the subsequent solder plating by obviating the necessity of separately degreasing.

Obviously, the present invention is not limited to the preferred embodiment described above. For example, the following variations or modifications can be made to the illustrated embodiment.

The glass particles as the abrasive material may be replaced by resin particles having an average diameter of no more than 200 micrometers, preferably no more than 100 micrometers, particularly no more than 50 micrometers, if such a small diameter becomes realizable due to a technological progress.

While there are four blasting nozzles 4 according to the illustrated embodiment, the number of the blasting nozzles 4 may be increased or decreased depending on the degree of peening desired for the particular leadframe F and/or the desired production speed.

The endless transfer belts 25 of the transfer assembly 3 may be replaced a pair of endless transfer chains. Further, the transfer assembly may be provided by a pair of V-grooved guide rails combined with a single endless transfer chain which has a plurality of engaging pawls each being engageable with a corresponding leadframe. Moreover, the transfer assembly 3 may be elongated into a frame punching unit for successively transferring punched leadframes from the punching unit to the pretreating apparatus 1, thereby providing a continuity between two different process steps.

The leadframe F may be transferred vertically by arranging the transfer belts 25 vertically together with necessary rearrangement of the related parts. In this case, apparently, the blasting nozzles 4 need be arranged on both sides of the vertical leadframe transfer path with their discharge openings 47a directed horizontally toward the vertically moving leadframe.

The leadframe F may be rendered substantially continuous. Further, the leadframe may have a pattern different from the one shown in FIGS. 15 and 16.

The above-described variations or modifications should not be regarded as a departure from the spirit and scope of the invention. The scope of the present invention should be determined only on the basis of the appended claims.

I claim:

1. A method for pretreating an electronic component manufacturing frame which is prepared by punching, the method comprising blasting abrasive particles entrained in a high speed air stream toward the frame, the abrasive particles having an average diameter of no more than 200 micrometers.

2. The method according to claim 1, wherein the abrasive particles has an average diameter of no more than 100 micrometers.

3. The method according to claim 1, wherein the abrasive particles has an average diameter of no more than 50 micrometers.

4. The method according to claim 1, wherein the abrasive particles comprises spherical glass particles.

5. The method according to claim 1, wherein the high speed air stream is a low pressure, high flow rate air stream.

6. The method according to claim 1, wherein the high speed air stream has a speed of no less than 100 m/s.

7. An apparatus for pretreating an electronic component manufacturing frame which is prepared by punching, the apparatus comprising a blasting chamber, a transfer assembly for transferring the frame in the blasting chamber, and at least one blasting nozzle arranged in the blasting chamber for blasting abrasive particles entrained in a high speed air stream toward the frame, wherein the abrasive particles has an average diameter of no more than 200 micrometers.

8. The apparatus according to claim 7, wherein the abrasive particles has an average diameter of no more than 50 micrometers.

9. The apparatus according to claim 7, wherein the abrasive particles comprises spherical glass particles.

10. The apparatus according to claim 7, wherein the blasting nozzle is supplied with air at a guage pressure of 0.3–0.6 atm for discharging the air stream at a high speed of no less than 100 m/s.

11. The apparatus according to claim 6, wherein there are provided at least two blasting nozzles for blasting the abrasive particles toward two opposite surfaces of the frame.

12. The apparatus according to claim 7, wherein the abrasive particles has an average diameter of no more than micrometers.

* * * * *